United States Patent
Hess et al.

(10) Patent No.: US 11,209,290 B2
(45) Date of Patent: Dec. 28, 2021

(54) RESOLVER/LVDT ODD HARMONIC DISTORTION COMPENSATION

(71) Applicant: Hamilton Sundstrand Corporation, Charlotte, NC (US)

(72) Inventors: Gary L. Hess, Somers, CT (US); Kirk A. Lillestolen, East Hartland, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 720 days.

(21) Appl. No.: 16/030,245

(22) Filed: Jul. 9, 2018

(65) Prior Publication Data
US 2020/0011708 A1   Jan. 9, 2020

(51) Int. Cl.
*G01D 5/22* (2006.01)
*H02K 11/225* (2016.01)
(Continued)

(52) U.S. Cl.
CPC .......... *G01D 5/2291* (2013.01); *H01F 21/06* (2013.01); *H01F 27/28* (2013.01); *H02K 11/225* (2016.01); *H02K 24/00* (2013.01); *H03M 1/485* (2013.01)

(58) Field of Classification Search
None
See application file for complete search history.

(56) References Cited

U.S. PATENT DOCUMENTS 4,972,186 A * 11/1990 Morris ............... G01D 5/243
                                              318/605
5,198,735 A *  3/1993 Taylor ............... G05B 19/33
                                              318/565
(Continued)

FOREIGN PATENT DOCUMENTS

EP    1746392 A1    1/2007
EP    2818834 A1   12/2014
EP    3239661 A1   11/2017

OTHER PUBLICATIONS

Extended European Search Report dated Sep. 17, 2019, received for corresponding European Application No. 19185011.4, 6 pages.
"Linear Variable Differential Transform", https://en.wikipedia.org/wiki/Linear_variable_differential_transformer, accessed May 23, 2018, 3 pages.
(Continued)

*Primary Examiner* — Patrick Assouad
*Assistant Examiner* — Haidong Zhang
(74) *Attorney, Agent, or Firm* — Kinney & Lange, P.A.

(57) ABSTRACT

A resolver system includes a rotatable primary winding, a secondary winding fixed relative to the rotatable primary winding, a tertiary winding fixed relative to the rotatable primary winding and positioned π/2 radians out of phase with respect to the fixed secondary winding, an excitation module electrically connected to the rotatable primary winding and configured to provide an excitation signal to the rotatable primary winding where the excitation signal is an alternating current waveform having a fundamental frequency, and a controller electrically connected to the secondary winding and configured to sample a voltage across the secondary winding at 18 times the fundamental frequency, sample a voltage across the tertiary winding at 18 times the fundamental frequency, and determine an amplitude of the fundamental frequency based on the sampled voltages across the secondary and tertiary windings, where the alternating current waveform includes a third harmonic frequency.

20 Claims, 3 Drawing Sheets

(51) Int. Cl.
    *H01F 21/06*     (2006.01)
    *H01F 27/28*     (2006.01)
    *H02K 24/00*     (2006.01)
    *H03M 1/48*     (2006.01)

(56) References Cited

U.S. PATENT DOCUMENTS

| | | | |
|---|---|---|---|
| 5,455,498 A | 10/1995 | Kakimoto et al. | |
| 7,123,175 B2 | 10/2006 | Katakura et al. | |
| 2006/0057976 A1* | 3/2006 | Klemmer | H04L 27/361 455/102 |
| 2006/0241436 A1* | 10/2006 | Sunnanvader | A61B 5/01 600/438 |
| 2016/0244176 A1* | 8/2016 | Xiao | H02P 5/74 |
| 2017/0299409 A1* | 10/2017 | Hess | G01D 5/2073 |
| 2018/0091123 A1* | 3/2018 | Park | H03K 3/80 |

OTHER PUBLICATIONS

"Resolver (electrical)", https://en.wikipedia.org/wiki/Resolver_(electrical), accessed May 22, 2018, 3 pages.

* cited by examiner

RESOLVER/LVDT ODD HARMONIC DISTORTION COMPENSATION

CROSS-REFERENCE TO RELATED APPLICATION(S)

This application is related to U.S. application Ser. No. 15/131,706, entitled SYSTEMS AND METHODS FOR DETERMINING ROTATIONAL POSITION, by inventors Gary L. Hess and Kanwalpreet Reen, filed on Apr. 18, 2016.

BACKGROUND

The present disclosure relates to movable components in machinery, and more particularly, to determining the rotational position of rotating components in rotating machinery and the linear position of linear components in linearly movable machinery.

Resolvers are commonly used to determine the rotational position of rotating components in rotating machinery. For example, resolvers are oftentimes associated with starter motor generators and actuators in aircraft to provide feedback regarding the state of the actuator, e.g., whether the actuator is open, partially open, or closed. A typical resolver includes an excitation coil carried by a rotating component that is rotatable relative to first and second secondary coils positioned 90-degrees out of phase with one another. A sinusoidal excitation signal supplied to the excitation coil induces corresponding output signals in the first and second secondary coils. By comparing the phase of the excitation signal to the phase of the output signals, the orientation or position of the excitation coil can be determined. In some applications, such as in high speed rotating machinery, the resolver output signals need to be sampled at rates that can approach the excitation frequency of the resolver.

In other applications, such as mechanical control systems, linear voltage differential transformers (LVDTs) are used to determine the linear position of linearly moving components. For example, LVDTs are oftentimes associated with fuel racks on gas turbine engines to provide feedback regarding the state of the fuel control valves, e.g., whether the valve is open, partially open, or closed. A typical LVDT includes an excitation coil linearly centered between first and secondary coils connected 180-degrees out of phase with one another, and a linearly movable ferromagnetic core that alters the mutual inductive coupling between the primary and each of the two secondary coils.

Because many resolver algorithms require a full sinusoid of the waveform to determine the shaft position, or utilize additional filtering as in full wave rectification, rotational position determination may be delayed or erroneous when rotational speed changes. Moreover, many instrumentation systems use a sinusoid waveform that contains harmonic frequencies of the fundamental frequency. In some systems, the odd harmonic frequencies can be the most prevalent because of the method used to generate the sinusoid waveform. Under some conditions, these odd harmonic frequencies can impair the accuracy of the rotational position that is sensed by the resolver, or the linear position that is sensed by the LVDT.

It would be beneficial to provide improved resolvers, LVDTs, the interfaces thereof, and methods of determining position using resolvers and LVDTs. The present disclosure provides a solution for this need.

SUMMARY

A system for determining an amplitude of a fundamental frequency of an electrical signal in the presence of odd harmonic frequencies includes a primary winding, a secondary winding, an excitation module electrically connected to the primary winding and configured to provide an excitation signal to the primary winding where the excitation signal is an alternating current waveform having the fundamental frequency, and a controller electrically connected to the secondary winding and configured to sample a voltage across the secondary winding at 18 times the fundamental frequency and determine the amplitude of the fundamental frequency based on the sampled voltage across the secondary winding.

A resolver system includes a rotatable primary winding, a fixed secondary winding fixed relative to the rotatable primary winding, a fixed tertiary winding fixed relative to the rotatable primary winding and positioned $\pi/2$ radians out of phase with respect to the fixed secondary winding, an excitation module electrically connected to the rotatable primary winding and configured to provide an excitation signal to the rotatable primary winding where the excitation signal is an alternating current waveform having a fundamental frequency, and a controller electrically connected to the fixed secondary winding and configured to sample a voltage across the secondary winding at 18 times the fundamental frequency, and to sample a voltage across the fixed tertiary winding at 18 times the fundamental frequency, and determine an amplitude of the fundamental frequency based on the sampled voltages across the fixed secondary and fixed tertiary windings, where the alternating current waveform includes a third harmonic frequency and the rotatable primary winding is mechanically connected to a rotatable component.

A system for determining an amplitude of a fundamental frequency of an electrical signal in the presence of a third harmonic frequency and a fifth harmonic frequency includes a primary winding, a secondary winding, a tertiary winding, an excitation module electrically connected to the primary winding and configured to provide an excitation signal to the primary winding, where the excitation signal is an alternating current waveform having a fundamental frequency, and a controller electrically connected to the secondary and tertiary windings and configured to sample a voltage across the secondary and tertiary windings at 90 times the fundamental frequency and determine the amplitude of the fundamental frequency based on the sampled voltages across the secondary and tertiary windings, where the alternating current waveform includes a third harmonic frequency and a fifth harmonic frequency.

DETAILED DESCRIPTION

The present disclosure provides a resolver and LVDT system with odd harmonic frequency distortion compensation. A harmonic frequency can be referred to as a "harmonic". For example, the second harmonic is twice the frequency of the fundamental frequency, the third harmonic is three times the frequency of the fundamental frequency, and so on. Many instrumentation systems use a sinusoid waveform that contains harmonic frequencies of the fundamental frequency. In some systems, the odd harmonic frequencies can be the most prevalent because of the method used to generate the sinusoid waveform. Therefore, under some conditions, the odd harmonics can impair the accuracy of the rotational position that is sensed by the resolver, or the linear position that is sensed by the LVDT. Exemplary values of the harmonics, and in particular the odd harmonics, will be described in FIGS. 3A and 3B.

U.S. Patent Application Publication No. 2017/0299409A1, by Gary L. Hess and Kanwalpreet Reen, discloses a resolver system that acquires, or samples, voltages on the secondary windings at time intervals corresponding to $\pi/3$ radians (60 deg.) of the excitation voltage oscillating waveform. Stated alternatively, the sampling rate is exactly six times the excitation waveform frequency. U.S. Patent Application Publication No. 2017/0299409A1 is hereby incorporated by reference in its entirety.

Figure 1:
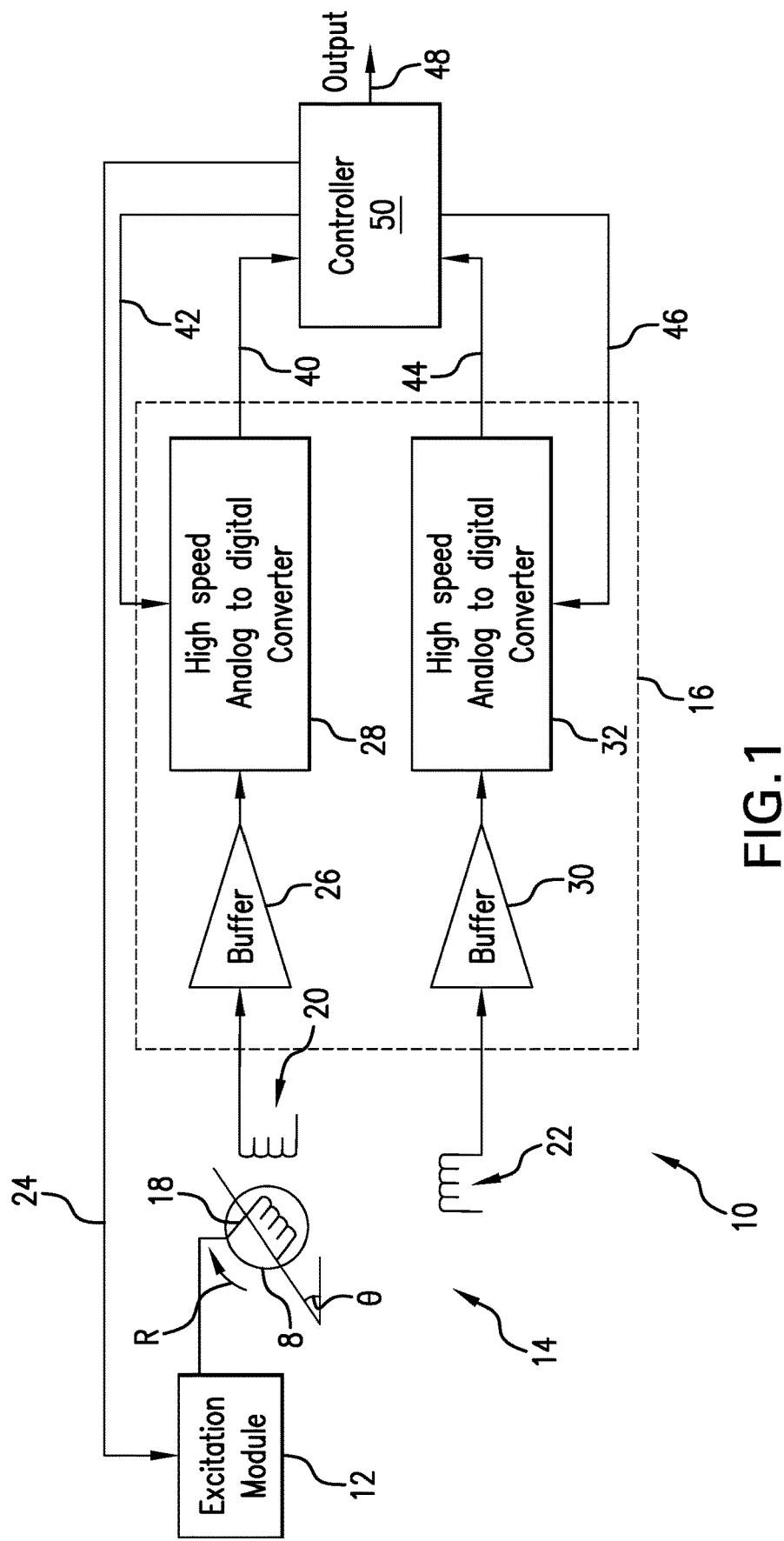
FIG. 1 is a schematic block diagram of a resolver system.

FIG. 1 is a schematic block diagram of a resolver system. Shown in FIG. 1 are rotating component 8, resolver system 10, excitation module 12, winding module 14, interface module 16, primary winding 18, first secondary winding 20, second secondary winding 22, first buffer 26, first analog-to-digital converter (ADC) 28, second buffer 30, second ADC 32, output 48, and controller 50. Winding module 14 includes primary winding 18, first secondary winding 20, and second secondary winding 22. Primary winding 18 is fixed to rotating component 8, which can be, for example, a shaft in a gas turbine engine. Primary winding 18 is electrically connected to excitation module 12. In other embodiments, rotating component 8 can be a shaft, dial, rotor, and so on, and can be any rotating mechanism on any system or component. Non-limiting examples of rotating component 8 include crankshafts on internal and external combustion engines, shafts on electromechanical machines, synchros, gyrocompasses, and dial indicators.

Referring again to FIG. 1, first secondary winding 20 and second secondary winding 22 are fixed relative to primary winding 18, and are electromagnetically coupled to primary winding 18. In other words, primary winding 18 is rotatable, whereas first secondary winding 20 and second secondary winding 22 are stationary. First secondary winding 20 and second secondary winding 22 are positioned $\pi/2$ radians (90 deg.) out of phase with respect to each other. First secondary winding 20 and second secondary winding 22 are both electrically connected to interface module 16. Excitation module 12 is electrically connected to primary winding 18 and is configured to generate an excitation voltage of oscillating magnitude having a period defined by controller 50. In some embodiments, controller 50 can be referred to as a control module. The frequency f of the oscillating excitation voltage is determined by an input received from controller 50 through excitation module input lead 24, which connects controller 50 with excitation module 12. In the illustrated embodiment, excitation module 12 applies an excitation voltage to primary winding 18 with a waveform having a sinusoidal shape and frequency f. The excitation voltage induces a first secondary voltage in first secondary winding 20 and a second secondary voltage in second secondary winding 22. Interface module 16 includes first buffer 26, first ADC 28, second buffer 30, and second ADC 32. First buffer 26 is electrically connected to first secondary winding 20 and receives voltage from first secondary winding 20. An ADC can also be referred to as a high-speed ADC. First buffer 26 is electrically connected to first ADC 28, which acquires periodic voltage measurements therefrom according to a sampling scheme defined by controller 50. In the illustrated embodiment, first ADC 28 acquires, or samples, the voltage on first secondary winding 20 at time intervals corresponding to $\pi/9$ radians (20 deg.) of the excitation voltage waveform. Stated alternatively, first ADC 28 has a sampling rate of exactly 18 times the excitation waveform frequency f.

Similarly, second buffer 30 is electrically connected to second secondary winding 22 and receives voltage from second secondary winding 22. Second buffer 30 is electrically connected to second ADC 32, which acquires periodic voltage measurements therefrom according to a sampling scheme defined by controller 50. In the illustrated embodiment, second ADC 32 acquires, or samples, the voltage on second secondary winding 22 at time intervals corresponding to $\pi/9$ radians (20 deg.) of the excitation voltage waveform. Stated alternatively, second ADC 32 has a sampling rate that is exactly 18 times the excitation waveform frequency f.

First ADC 28 is electrically connected to control module 50 through first output lead 40 and first input lead 42. Based on a sampling scheme received from controller 50 through input lead 42, first ADC 28 provides periodic voltage measurements to control module 50 through first output lead 40. Second ADC 32 is similar to first ADC 28 with the difference that second ADC 32 is electrically connected to controller 50 through second output lead 44 and second input lead 46. Based on the sampling scheme received from controller 50 through input lead 46, second ADC 32 also provides periodic voltage measurements to controller 50 through output lead 44. Control module 50 receives the voltage measurements from first ADC 28 and second ADC 32, and provides an output voltage at resolver output terminal 48 that corresponds to the rotational position of primary winding 18, and therefore, the rotational position θ of shaft 8. In the illustrated embodiment, the output voltage at terminal 48 is a root mean square (RMS) voltage. Controller 50 causes first ADC 28 and second ADC 32 to acquire at least nine voltage measurements within one-half the period of the excitation waveform. Each of the at least nine voltage measurements is offset from another of the at least nine voltage measurements by $\pi/9$ radians (20 deg.) of one-half the period of the excitation waveform. In this respect, a second voltage measurement occurs $\pi/9$ radians (20 deg.) after a first voltage measurement, a third voltage measurement occurs $\pi/9$ radians (20 deg.) after a second voltage measurement, and so on. The sampling of voltages at first secondary winding 20 by first ADC 28, and at second secondary winding 22 by second ADC 32, is synchronized by controller 50 with the excitation waveform that is applied to primary winding 18 by excitation module 12. In the illustrated embodiment, the voltage measurements of first secondary winding 20 and second secondary winding 22 occur at the same point in time. That is, there is zero phase shift between these measurements. In other embodiments, the voltage measurements of first secondary winding 20 and second secondary winding 22 occur can occur at different points in time, so long as the sampling rates follow the algorithm described herein. That is, in these other embodiments, there is a measurable phase shift between these measurements. The method of the present disclosure, whereby voltages are sampled at first secondary winding 20 at exactly $\pi/9$ radians (20 deg.) apart, and voltages are sampled at second secondary winding 22 at exactly $\pi/9$ radians (20 deg.) apart, is therefore phase insensitive. The sampling of voltages at first secondary winding 20 and second secondary winding 22 each at exactly $\pi/9$ radians (20 deg.) apart will be described in greater detail in FIGS. 3A and 3B.

In the illustrated embodiment, resolver system 10 can provide positional measurement with less than 0.01% error. In some embodiments, resolver system 10 can include only first secondary winding 20, with second secondary winding 22 being excluded. In these embodiments, useful positional information can be provided for rotating component 8 by resolver system 10. However, in these other embodiments, the positional measurement error can be greater than that for resolver system 10 depicted in FIG. 1.

In other embodiments, more than two secondary windings can be used. In yet other embodiments, more than one primary winding can be used. Accordingly, the present disclosure includes all combinations of primary and secondary windings on winding module 14 of resolver system 10.

Figure 2:
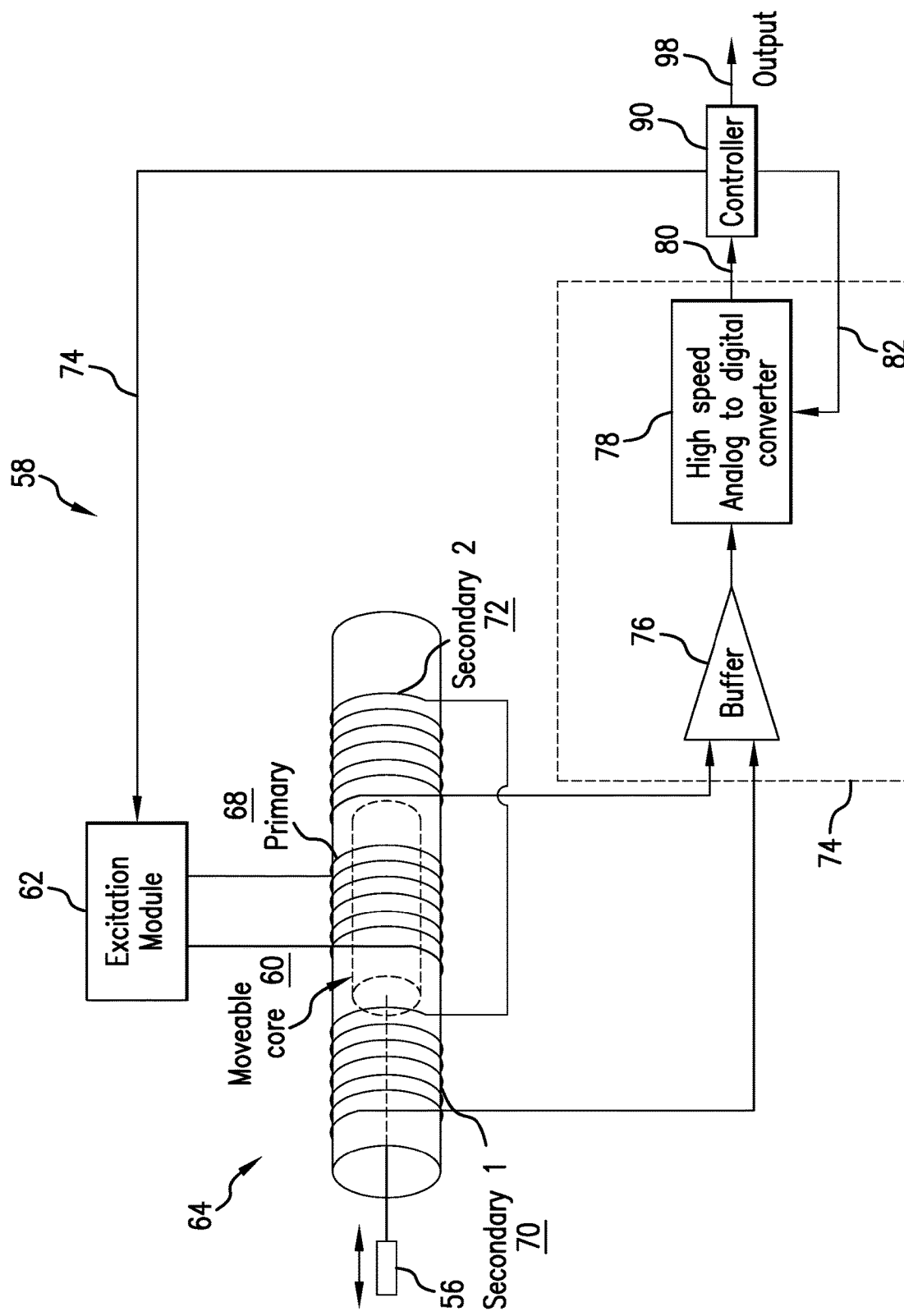
FIG. 2 is a schematic block diagram of a linear voltage differential transformer detector.

FIG. 2 is a schematic block diagram of a linear voltage differential transformer (LVDT) detector. Shown in FIG. 2 are linearly movable component 56, LVDT system 58, movable core 60, excitation module 62, winding module 64, winding spool 66, primary winding 68, first secondary winding 70, second secondary winding 72, interface module 74, buffer 76, ADC 78, ADC output 80, input lead 82, controller 90, and output terminal 98. Winding module 64 includes winding spool 66, primary winding 68, first secondary winding 70, and second secondary winding 72. Primary winding 68, first secondary winding 70, and second secondary winding 72 are each fixed on winding spool 66, and are thus fixed relative to each other. Movable core 60 is mechanically connected to linearly movable component 56, which may be a linear component in a gas turbine engine. Movable core 60 includes ferromagnetic material that, when in the proximity of the primary winding 68, first secondary winding 70, and second secondary winding 72, creates magnetic flux coupling between primary winding 68 and first secondary winding 70, and between primary winding 68 and second secondary winding 72. In the illustrated embodiment, movable core 60 has a length that is less than the length of winding spool 66, with the lengths being measured along the axis of motion of linearly movable component 56. Primary winding 68 is electrically connected to excitation module 62. In other embodiments, linearly movable component 56 can be any linearly movable mechanism on any mechanical or electromechanical component or system.

Referring again to FIG. 2, first secondary winding 70 and second secondary winding 72 are electromagnetically coupled to primary winding 68. First secondary winding 70 and second secondary winding 72 are positioned on opposite ends of winding spool 66 relative to each other. In the illustrated embodiment, first secondary winding 70 and second secondary winding 72 are electrically connected in series with each other, and out of phase with each other. Accordingly, the electrical output from series-connected first secondary winding 70 and second secondary winding 72 is provided to interface module 74. Interface module 74 includes buffer 76 and ADC 78. Buffer 76 is electrically connected to ADC 78, which acquires periodic voltage measurements therefrom according to a sampling scheme defined by control module 90. In the illustrated embodiment, ADC 78 acquires, or samples, the voltage on series-connected first secondary winding 70 and second secondary winding 72 at time intervals corresponding to $\pi/9$ radians (20 deg.) of the excitation voltage waveform. Stated alternatively, first ADC 78 has a sampling rate is exactly 18 times the excitation waveform frequency f.

The sampling is synchronized by controller 90 with the excitation waveform that is applied to primary winding 68 by excitation module 62. The sampling of voltages at first secondary winding 70 and second secondary winding 72 at exactly $\pi/9$ radians (20 deg.) apart will be described in greater detail in FIGS. 3A and 3B.

In other embodiments, first secondary winding 70 and second secondary winding 72 can have other configurations. For example, in other embodiments, first secondary winding 70 can provide an input to a first buffer and a first ADC (not shown), and second secondary winding 72 can provide an input to a second buffer and a second ADC (not shown), thereby resulting in a circuit configuration similar to that for resolver system 10 shown in FIG. 1.

In the illustrated embodiment, LVDT system 58 can provide positional measurement with less than 0.01% error. In some embodiments, LVDT system 58 can include only first secondary winding 70, with second secondary winding 72 being excluded. In these embodiments, useful positional information can be provided for linearly movable component 56 by LVDT system 58. However, in these other embodiments, the positional measurement error can be greater than that for LVDT system 58 depicted in FIG. 2.

In other embodiments, more than two secondary windings can be used. In yet other embodiments, more than one primary winding can be used. Accordingly, the present disclosure includes all combinations of primary and secondary windings on winding module 64 of LVDT system 58.

Figure 3A:
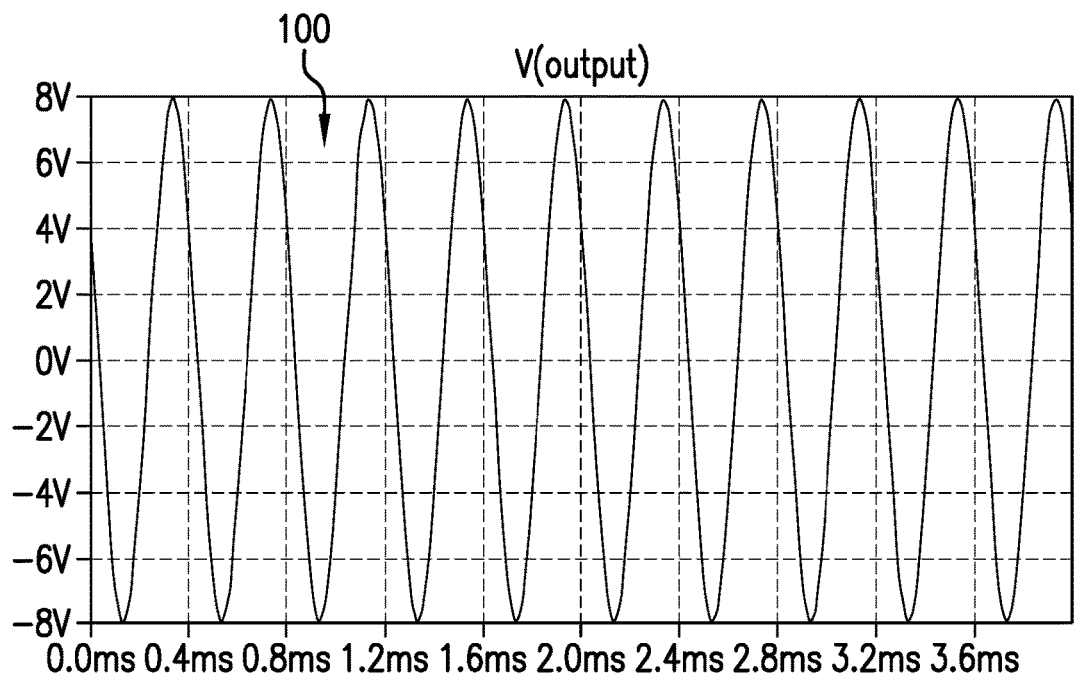
FIG. 3A is a waveform depicting an excitation signal.

FIG. 3A is a waveform depicting an excitation signal. Shown in FIG. 3A is sinusoid waveform 100 on a graph of amplitude vs. time. For example, sinusoid waveform 100 can depict the excitation signal in FIGS. 1 and 2. In the illustrated embodiment, sinusoid waveform 100 has a period of 0.4 milliseconds (ms). Accordingly, sinusoid waveform 100 has a frequency f of 2,500 Hz (2.5 KHz). Sinusoid waveform 100 has peak amplitude of approximately 8 volts. Accordingly, the RMS value of sinusoid waveform 100 is given by Equation 1:

$$V_{RMS} = \sqrt{\frac{1}{2}} \cdot V_{PEAK}$$

In the illustrated embodiment, sinusoid waveform 100 approximates a pure sinewave, but minor differences between sinusoid waveform 100 and a pure sinewave can be observed when analyzing the frequency spectrum of sinusoid waveform 100.

Figure 3B:
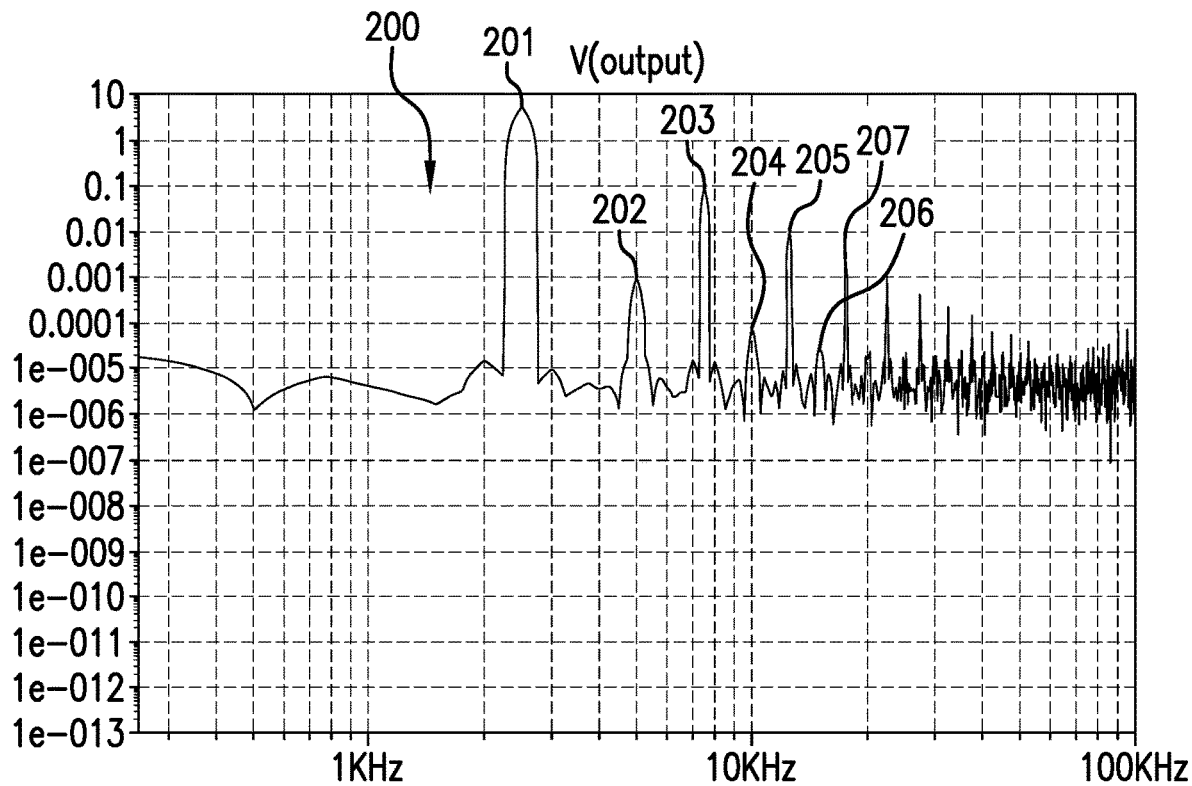
FIG. 3B is a waveform depicting the frequency spectrum of the excitation signal of FIG. 3A.

FIG. 3B is a waveform depicting the frequency spectrum of the excitation signal of FIG. 3A. The waveform depicted in FIG. 3B is on a graph of amplitude vs. frequency on logarithmic axes. Shown is FIG. 3B are frequency spectrum trace 200, fundamental frequency peak 201, second harmonic peak 202, third harmonic peak 203, fourth harmonic peak 204, fifth harmonic peak 205, sixth harmonic peak 206, and seventh harmonic peak 207. Additional harmonic peaks can be seen in FIG. 3B, but are not labeled.

In the illustrated embodiment, the RMS value of the excitation voltage in FIG. 3A is 5.541725 volts (v). Table 1 lists the RMS value of fundamental frequency peak 201, second harmonic peak 202, third harmonic peak 203, fourth harmonic peak 204, fifth harmonic peak 205, sixth harmonic peak 206, and seventh harmonic peak 207.

TABLE 1

| Harmonic | Freq. (KHz) | RMS Value (volts) | Excitation | % of Excitation |
|---|---|---|---|---|
| 1 | 2.5 | 5.541725 | 5.541725 | 100.00% |
| 2 | 5 | 0.0008 | 5.541725 | 0.01% |

TABLE 1-continued

| Harmonic | Freq. (KHz) | RMS Value (volts) | Excitation | % of Excitation |
|---|---|---|---|---|
| 3 | 7.5 | 0.097642 | 5.541725 | 1.76% |
| 4 | 10 | 0.00008 | 5.541725 | 0.00% |
| 5 | 12.5 | 0.0099 | 5.541725 | 0.18% |
| 6 | 15 | 0.00003 | 5.541725 | 0.00% |
| 7 | 17.5 | 0.0026 | 5.541725 | 0.05% |

As shown by the RMS voltage values for the harmonics in Table 1, resolver system 10 and/or LVDT system 58 can have error sources due to harmonic distortion of their waveforms. This distortion can cause inaccuracies in the detection algorithms used in resolver system 10 and/or LVDT system 58, because these detection algorithms assume that the waveforms are pure sinewaves but sinusoid waveform 100 can often have harmonic distortion. As shown by frequency spectrum trace 200 in FIG. 3B and in Table 1 above, the greatest harmonic distortion tends to have the highest amplitudes for odd harmonics (e.g., third harmonic peak 203, fifth harmonic peak 205, seventh harmonic peak 207). At least two reasons can explain the relatively high amplitudes for odd harmonics. In some embodiments, sinusoid waveform 100 is a filtered square wave, and square waves are known to those in the electrical arts to be an infinite series of odd harmonics. Also, any compression of sinusoid waveform 100 is usually symmetrical in nature, thereby manifesting odd harmonics. Waveform compression can result from nonlinear amplifier performance, for example.

In the illustrated embodiment, as shown in FIG. 3B and in Table 1, third harmonic peak 203 has an RMS value that is 1.7% of the RMS value of the excitation voltage. Collectively, the total harmonic distortion (THD) of sinusoid waveform 100 is approximately 1.8%. Accordingly, in some embodiments, removal of third harmonic peak 203 can result in THD of less than 0.19%.

Referring back to FIG. 2, even though first secondary winding 70 and second secondary winding 72 of LVDT system 58 can have the same THD, the distortion does not completely cancel due to gain correction because of phase shifts between first secondary winding 70 and second secondary winding 72. Accordingly, elimination of third harmonic peak 203 can still be beneficial in LVDT system 58.

As described above in FIG. 1, first ADC 28 and second ADC 32 has a sampling rate that is clocked at exactly π/9 radians (20 deg.) intervals. Stated alternatively, first ADC 28 and second ADC 32 has a sampling rate that is exactly 18 times the excitation frequency f of sinusoid waveform 100. Similarly, as described above in FIG. 2, ADC 78 has a sampling rate that is clocked at exactly π/9 radians (20 deg.) intervals, or exactly 18 times the excitation frequency f of sinusoid waveform 100. Sampling the voltages at first secondary winding 20 and second secondary winding 22 at exactly π/9 radians (20 deg.) intervals allows for exact calculation of the RMS values of these voltages. The sampling is also accomplished prior to completion of the waveform period, allowing for rapid determination of the RMS value of the voltages, advantageously allowing for both accurate and rapid determination of rotational position of shaft 8 during time intervals when the rotational speed of shaft 8 changes. In particular, the RMS value of the voltages at terminals 40 and 44 in FIG. 1, and respectively, is given by Equation 2:

$$V_{RMS} = \sqrt{\frac{\sum_{J}(V_J - V_{DC})}{J}} \text{ where } V_{DC} = \sum_{J} V_J$$

Referring again to FIG. 3B, because the most prevalent harmonic causing THD is the third harmonic (having third harmonic peak 203), sampling at equal intervals of 1/18th the excitation frequency f (i.e., π/9 radians, or 20 deg.) will suppress the third harmonic. This is because the sampling frequency is six times the frequency of the third harmonic. For example, in the embodiment depicted in FIG. 1, sinusoid waveform 100 has a fundamental frequency of 2.5 KHz, and the third harmonic is 7.5 KHz. Accordingly, in the illustrated embodiment where the excitation frequency f is 2.5 KHz, the sampling frequency should be 45 KHz to suppress third harmonic peak 203.

The concept of the present disclosure is not intuitive, and can be counter-intuitive, to those who are skilled in sampling algorithms. Testing of the present disclosure has shown that sampling at exactly 18 times the excitation frequency f produces an accuracy that is far greater than sampling at 24 times the excitation frequency f. This is explained by noting that a sampling rate of 24 times the excitation frequency f does not fully eliminate the effects of the third harmonic. Moreover, those who are skilled in the electrical arts typically look to a sampling rate that is greater than the Nyquist rate, with sampling rates often being given as $2^N$, for example, multiples of 8, 16, 32, 64, etc. a fundamental frequency f.

In other embodiments, if one wanted even greater accuracy, fifth harmonic peak 205 can also be suppressed by using a sampling rate that is six times the lowest common multiple frequency of the third and fifth harmonics, or 15. Accordingly, a sampling rate of 90 times the excitation frequency f would suppress third harmonic peak 203 and fifth harmonic peak 205. For example, in the embodiment illustrated in FIG. 3A with an excitation frequency f of 2.5 KHz, the resulting sampling rate would be 225 KHz to suppress third harmonic peak 203 and fifth harmonic peak 205. In yet other embodiments, if one wanted even greater accuracy, seventh harmonic peak 207 can also be suppressed by using a sampling rate that is six times the least common multiple frequency of the third, fifth, and seventh harmonics, or 105. Accordingly, a sampling rate of 630 times the excitation frequency f would suppress third harmonic peak 203, fifth harmonic peak 205, and seventh harmonic peak 207. For example, in the embodiment illustrated in FIG. 3A with an excitation frequency f of 2.5 KHz, the resulting sampling rate would be 1.575 MHz to suppress third harmonic peak 203, fifth harmonic peak 205, and seventh harmonic peak 207. As can be seen from this relationship, suppression of higher order odd harmonics can be achieved by using a sampling rate that is six times the least common multiple frequency of those harmonics.

Referring again to FIGS. 1 and 2, the computing algorithm that is incorporated in controllers 50, 90 can be implemented in either hardware and/or software. Implementation of the sampling algorithm at 18 times the excitation frequency f can dramatically reduce the computing overhead that can be required in traditional sampling architectures. In some embodiments, the computing algorithm that is incorporated in controllers 50, 90 can eliminate the need for performing fast Fourier transforms (FFTs). Accordingly, the reduced computing burden of the computing algorithm of the present disclosure can significantly reduce the associated size and weight, as well as the power and cooling requirements. The sampling and computing algorithms that are performed by controllers 50, 90 can be implemented in either hardware or software, or a combination of both hardware and software.

It should be understood that the computing algorithms that are performed by controllers 50, 90 can be implemented in digital logic or by a processor, and can involve computing in-phase and quadrature-phase resultants of the sampled output signals of winding modules 14, 64. Further, it should also be noted that a computing device can be used to implement various functionality, such as that attributable to the method of digital demodulation and other functions performed by a field-programmable gate array (FPGA). In terms of hardware architecture, such a computing device can include a processor, a memory, and one or more input and/or output (I/O) device interface(s) that are communicatively coupled via a local interface. The local interface can include, for example but not limited to, one or more buses and/or other wired or wireless connections. The local interface may have additional elements, which are omitted for simplicity, such as controllers, buffers (caches), drivers, repeaters, and receivers to enable communications. Further, the local interface may include address, control, and/or data connections to enable appropriate communications among the aforementioned components.

The aforementioned processor can be a hardware device for executing software, particularly software stored in memory. The processor can be a custom made or commercially available processor, a central processing unit (CPU), an auxiliary processor among several processors associated with the computing device, a semiconductor based microprocessor (in the form of a microchip or chip set) or generally any device for executing software instructions. The memory can include any one or combination of volatile memory elements, e.g., random access memory (RAM, such as DRAM, SRAM, SDRAM, VRAM, etc.) and/or nonvolatile memory elements, e.g., ROM, hard drive, tape, CD-ROM, etc. Moreover, the memory may incorporate electronic, magnetic, optical, and/or other types of storage media. Note that the memory can also have a distributed architecture, where various components are situated remotely from one another, but can be accessed by the processor. The software in the memory may include one or more separate programs, each of which includes an ordered listing of executable instructions for implementing logical functions. A system component embodied as software may also be construed as a source program, executable program (object code), script, or any other entity comprising a set of instructions to be performed. When constructed as a source program, the program is translated via a compiler, assembler, interpreter, or the like, which may or may not be included within the memory.

The aforementioned I/O devices that may be coupled to system I/O Interface(s) may include input devices, for example but not limited to, a keyboard, mouse, scanner, microphone, camera, proximity device, etc. Further, the I/O devices may also include output devices, for example but not limited to, a printer, display, etc. Finally, the I/O devices may further include devices that communicate both as inputs and outputs, for instance but not limited to, a modulator/demodulator (modem) for accessing another device, system, or network; a radio frequency (RF) or other transceiver; or a telephonic interface, bridge, router, etc. When the computing device is in operation, the processor can be configured to execute software stored within the memory, to communicate data to and from the memory, and to generally control operations of the computing device pursuant to the software. Software in memory, in whole or in part, is read by the processor, perhaps buffered within the processor, and then executed.

In the embodiment illustrated in FIGS. 3A and 3B, the excitation frequency of sinusoidal waveform 100 was shown to be 2,500 Hz. In other embodiments, the excitation frequency can be between 2,000-3,500 Hz. In some other embodiments, the excitation frequency can be between 400-5,000 Hz. In yet other embodiments, the excitation frequency can be less than 400 Hz or greater than 5,000 Hz. In some embodiments, multiple resolver systems 10 and/or LVDT systems 58 can be operating in the vicinity of each other. In these embodiments, particularly where these multiple systems can have common power supplies, common cable runs, and so on, it can be important that the multiple systems each operate at different excitation frequencies to prevent mutual interference. For example, a first resolver system 10 can operate at an excitation frequency of 2,400 Hz, a second resolver system 10 can operate at an excitation frequency of 2,525 Hz, and a third resolver system 10 can operate at an excitation frequency of 2,630 Hz. The foregoing examples are non-limiting.

In the embodiment illustrated in FIGS. 3A and 3B, the amplitude of sinusoidal waveform 100 was shown to be about 8 volts peak. In some embodiments, the amplitude of sinusoidal waveform 100 can be between 5-12 volts peak. In other embodiments, the amplitude of sinusoidal waveform 100 can be less than 5 volts peak or greater than 12 volts peak.

In the embodiment illustrated in FIG. 1, rotating component 8 rotates completely and either continuously or intermittently. In some embodiments, rotating component 8 can rotate in either a forward (clockwise) or a reverse (counter-clockwise) direction. In other embodiments, rotating component 8 can rotate in an arc that is less than $2\pi$ radians (360 deg.)

In the embodiment illustrated in FIG. 2, linearly movable component 56 can have a range of motion between about 2.5 cm (0.98 inches)-5 cm (1.97 inches). In some embodiments, linearly movable component 56 can have a range of motion that is less than 2.5 cm (0.98 inches). In other embodiments, linearly movable component 56 can have a range of motion that is greater than 5 cm (1.97 inches). In yet other embodiments, linearly movable component 56 can have a range of motion that is greater than 25 cm (9.84 inches).

Discussion of Possible Embodiments

The following are non-exclusive descriptions of possible embodiments of the present invention.

A system for determining an amplitude of a fundamental frequency of an electrical signal in the presence of odd harmonic frequencies, the system comprising: a primary winding; a secondary winding; an excitation module electrically connected to the primary winding and configured to provide an excitation signal to the primary winding, wherein the excitation signal is an alternating current waveform having the fundamental frequency; and a controller electrically connected to the secondary winding and configured to: sample a voltage across the secondary winding at 18 times the fundamental frequency; and determine the amplitude of the fundamental frequency based on the sampled voltage across the secondary winding.

The system of the preceding paragraph can optionally include, additionally and/or alternatively, any one or more of the following features, configurations and/or additional components:

A further embodiment of the foregoing system, wherein: the primary winding is rotatable; the secondary winding is fixed relative to the primary winding; and the tertiary winding is fixed relative to the primary winding and positioned out of phase with respect to the secondary winding.

A further embodiment of the foregoing system, wherein the tertiary winding is positioned π/2 radians out of phase with respect to the secondary winding.

A further embodiment of the foregoing system, wherein the amplitude is representative of a rotary position of the primary winding.

A further embodiment of the foregoing system, further comprising a movable core, wherein: the primary winding has an interior and is fixed; the secondary winding has an interior and is fixed; and the movable core is positioned on the interior of the primary winding.

A further embodiment of the foregoing system, wherein the amplitude is representative of a linear position of the movable core.

A further embodiment of the foregoing system, wherein the fundamental frequency is between 2,000-3,500 Hz.

A further embodiment of the foregoing system, wherein the excitation signal further comprises a peak amplitude between 5-12 volts.

A further embodiment of the foregoing system, further comprising: an interface module, the interface module including: one or more buffers; and one or more analog-to-digital converters; one or more processors; and computer-readable memory encoded with instructions that, when executed by the one or more processors, cause the system to: produce, by the excitation module, the alternating current waveform having the fundamental frequency; sample the voltage across the secondary winding at 18 times the fundamental frequency; sample the voltage across the tertiary winding at 18 times the fundamental frequency; and determine the amplitude of the fundamental frequency based on the sampled voltages across the secondary and tertiary windings.

A further embodiment of the foregoing system, wherein: the amplitude is indicative of a rotary position of the primary winding; and the primary winding is mechanically connected to a rotatable shaft.

A further embodiment of the foregoing system, further comprising a linear voltage differential transformer (LVDT) system comprising the foregoing system, and further comprising: a tertiary winding, fixed relative to the primary winding and positioned distal to the secondary winding; and a movable core, disposed proximate to the primary winding and mechanically connected to a linearly movable component.

A further embodiment of the foregoing system, further comprising: an interface module, the interface module including: one or more buffers; and one or more analog-to-digital converters; one or more processors; and computer-readable memory encoded with instructions that, when executed by the one or more processors, cause the system to: produce, by the excitation module, the alternating current waveform having the fundamental frequency; sample the voltage across the secondary winding at 18 times the fundamental frequency; sample the voltage across the tertiary winding at 18 times the fundamental frequency; and determine the amplitude of the fundamental frequency based on the sampled voltages across the secondary and tertiary windings.

A further embodiment of the foregoing system, wherein: the linearly movable component further comprises a range of motion; and the range of motion is between 2.5-5 cm.

A further embodiment of the foregoing system, further comprising a plurality of the foregoing systems, wherein the fundamental frequencies of each of the plurality of systems are different.

A resolver system comprising: a rotatable primary winding; a fixed secondary winding, fixed relative to the rotatable primary winding; a fixed tertiary winding, fixed relative to the rotatable primary winding and positioned π/2 radians out of phase with respect to the fixed secondary winding; an excitation module electrically connected to the rotatable primary winding and configured to provide an excitation signal to the rotatable primary winding, wherein the excitation signal is an alternating current waveform having a fundamental frequency; and a controller electrically connected to the fixed secondary and fixed tertiary windings and configured to: sample a voltage across the fixed secondary winding at 18 times the fundamental frequency; sample a voltage across the fixed tertiary winding at 18 times the fundamental frequency; and determine an amplitude of the fundamental frequency based on the sampled voltages across the secondary and tertiary windings; wherein the alternating current waveform includes a third harmonic frequency; and wherein the rotatable primary winding is mechanically connected to a rotatable component.

The system of the preceding paragraph can optionally include, additionally and/or alternatively, any one or more of the following features, configurations and/or additional components:

A further embodiment of the foregoing system, wherein the rotatable component comprises a rotary shaft.

A further embodiment of the foregoing system, wherein the rotary shaft is mechanically connected to a rotating machine.

A system for determining an amplitude of a fundamental frequency of an electrical signal in the presence of a third harmonic frequency and a fifth harmonic frequency, the system comprising: a primary winding; a secondary winding; a tertiary winding; an excitation module electrically connected to the primary winding and configured to provide an excitation signal to the primary winding, wherein the excitation signal is an alternating current waveform having a fundamental frequency; and a controller electrically connected to the secondary and tertiary windings and configured to: sample a voltage across the secondary winding at 90 times the fundamental frequency; sample a voltage across the tertiary winding at 90 times the fundamental frequency; and determine an amplitude of the fundamental frequency based on the sampled voltages across the secondary and tertiary windings; wherein the alternating current waveform includes a third harmonic frequency and a fifth harmonic frequency.

The system of the preceding paragraph can optionally include, additionally and/or alternatively, any one or more of the following features, configurations and/or additional components:

A further embodiment of the foregoing system, wherein the fundamental frequency is between 2,000-3,500 Hz.

A further embodiment of the foregoing system, wherein the excitation signal further comprises a peak amplitude between 5-12 volts.

The invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for determining an amplitude of a fundamental frequency of an electrical signal in the presence of odd harmonic frequencies, the system comprising:
a primary winding;
a secondary winding;
an excitation module electrically connected to the primary winding and configured to provide an excitation signal to the primary winding, wherein the excitation signal is an alternating current waveform having the fundamental frequency; and
a controller electrically connected to the secondary winding and configured to:
sample a voltage across the secondary winding at 18 times the fundamental frequency; and
determine the amplitude of the fundamental frequency based on the sampled voltage across the secondary winding.

2. The system of claim 1, further comprising a tertiary winding, wherein:
the primary winding is rotatable;
the secondary winding is fixed relative to the primary winding; and
the tertiary winding is fixed relative to the primary winding and positioned out of phase with respect to the secondary winding.

3. The system of claim 2, wherein the tertiary winding is positioned $\pi/2$ radians out of phase with respect to the secondary winding.

4. The system of claim 2, wherein the amplitude is representative of a rotary position of the primary winding.

5. The system of claim 1, further comprising a movable core, wherein:
the primary winding has an interior and is fixed;
the secondary winding has an interior and is fixed; and
the movable core is positioned on the interior of the primary winding.

6. The system of claim 5, wherein the amplitude is representative of a linear position of the movable core.

7. The system of claim 1, wherein the fundamental frequency is between 2,000-3,500 Hz.

8. The system of claim 1, wherein the excitation signal further comprises a peak amplitude between 5-12 volts.

9. The system of claim 2, further comprising:
an interface module, the interface module including:
one or more buffers; and
one or more analog-to-digital converters;
one or more processors; and
computer-readable memory encoded with instructions that, when executed by the one or more processors, cause the system to:
produce, by the excitation module, the alternating current waveform having the fundamental frequency;
sample the voltage across the secondary winding at 18 times the fundamental frequency;
sample the voltage across the tertiary winding at 18 times the fundamental frequency; and
determine the amplitude of the fundamental frequency based on the sampled voltages across the secondary and tertiary windings.

10. The system of claim 2, wherein:
the amplitude is indicative of a rotary position of the primary winding; and
the primary winding is mechanically connected to a rotatable shaft.

11. A linear voltage differential transformer (LVDT) system comprising the system of claim 1, and further comprising:
a tertiary winding, fixed relative to the primary winding and positioned distal to the secondary winding; and
a movable core, disposed proximate to the primary winding and mechanically connected to a linearly movable component.

12. The system of claim 11, further comprising:
an interface module, the interface module including:
one or more buffers; and
one or more analog-to-digital converters;
one or more processors; and
computer-readable memory encoded with instructions that, when executed by the one or more processors, cause the system to:
produce, by the excitation module, the alternating current waveform having the fundamental frequency;
sample the voltage across the secondary winding at 18 times the fundamental frequency;
sample the voltage across the tertiary winding at 18 times the fundamental frequency; and
determine the amplitude of the fundamental frequency based on the sampled voltages across the secondary and tertiary windings.

13. The LVDT system of claim 11, wherein:
the linearly movable component further comprises a range of motion; and
the range of motion is between 2.5-5 cm.

14. A plurality of the systems of claim 1, wherein the fundamental frequencies of each of the plurality of systems are different.

15. A resolver system comprising:
a rotatable primary winding;
a fixed secondary winding, fixed relative to the rotatable primary winding;
a tertiary winding, fixed relative to the rotatable primary winding and positioned $\pi/2$ radians out of phase with respect to the fixed secondary winding;
an excitation module electrically connected to the rotatable primary winding and configured to provide an excitation signal to the rotatable primary winding, wherein the excitation signal is an alternating current waveform having a fundamental frequency; and
a controller electrically connected to the fixed secondary and fixed tertiary windings and configured to:
sample a voltage across the fixed secondary winding at 18 times the fundamental frequency;
sample a voltage across the fixed tertiary winding at 18 times the fundamental frequency; and
determine an amplitude of the fundamental frequency based on the sampled voltages across the fixed secondary and fixed tertiary windings;
wherein the alternating current waveform includes a third harmonic frequency; and
wherein the rotatable primary winding is mechanically connected to a rotatable component.

16. The resolver system of claim 15, wherein the rotatable component comprises a rotary shaft.

17. The resolver system of claim 16, wherein the rotary shaft is mechanically connected to a rotating machine.

18. A system for determining an amplitude of a fundamental frequency of an electrical signal in the presence of a third harmonic frequency and a fifth harmonic frequency, the system comprising:
- a primary winding;
- a secondary winding;
- a tertiary winding;
- an excitation module electrically connected to the primary winding and configured to provide an excitation signal to the primary winding, wherein the excitation signal is an alternating current waveform having a fundamental frequency; and
- a controller electrically connected to the secondary and tertiary windings and configured to:
  - sample a voltage across the secondary winding at 90 times the fundamental frequency;
  - sample a voltage across the tertiary winding at 90 times the fundamental frequency; and
  - determine an amplitude of the fundamental frequency based on the sampled voltages across the secondary and tertiary windings;
- wherein the alternating current waveform includes a third harmonic frequency and a fifth harmonic frequency.

19. The system of claim 18, wherein the fundamental frequency is between 2,000-3,500 Hz.

20. The system of claim 18, wherein the excitation signal further comprises a peak amplitude between 5-12 volts.

* * * * *